United States Patent [19]
Tomioka

[11] Patent Number: 5,641,989
[45] Date of Patent: *Jun. 24, 1997

[54] SEMICONDUCTOR DEVICE HAVING FIELD-SHIELD ISOLATION STRUCTURES AND A METHOD OF MAKING THE SAME

[75] Inventor: Yugo Tomioka, Tokyo, Japan

[73] Assignee: Nippon Steel Corporation, Tokyo, Japan

[*] Notice: The term of this patent shall not extend beyond the expiration date of Pat. No. 5,498,898.

[21] Appl. No.: 455,533

[22] Filed: May 31, 1995

[30] Foreign Application Priority Data

Jun. 3, 1994 [JP] Japan ................................ 6-145496

[51] Int. Cl.$^6$ ................................................ H01L 23/58
[52] U.S. Cl. .................... 257/630; 257/315; 257/316; 257/409; 257/508
[58] Field of Search .................. 257/630, 315, 257/316, 508, 409

[56] References Cited

U.S. PATENT DOCUMENTS

| | | | |
|---|---|---|---|
| 5,164,806 | 11/1992 | Nagatomo et al. | 257/409 |
| 5,498,898 | 3/1996 | Kawamura | 257/630 |

FOREIGN PATENT DOCUMENTS

| | | |
|---|---|---|
| 5-136429 | 6/1993 | Japan . |
| 5-198778 | 8/1993 | Japan . |

OTHER PUBLICATIONS

1988 IEDM, pp. 246–249, by Wakamiya et al., Dec. 1988.
A 3.6 um$^2$ Memory Cell Structure for 16 MB EPROM, Y. Hisamune et al., IEDM-89, Dec. 1989, pp. 583–586.

*Primary Examiner*—Mark V. Prenty
*Attorney, Agent, or Firm*—Pollock, Vande Sande & Priddy

[57] ABSTRACT

A semiconductor device includes a semiconductor substrate of a first conductivity type, a plurality of spaced field-shield isolation structures formed on a surface of the substrate and extending parallelly in a first direction to provide element-forming regions at spaces between every adjacent two of the field-shield element isolation layers, a pair of impurity diffusion layers of a second conductivity type different from the first conductivity type formed in the surface of the substrate at portions adjacent opposite sides of each of the element-forming regions, a plurality of spaced lateral regions defined on the surface of the substrate and extending parallelly in a second direction intersecting with the first direction; and a plurality of discrete gate electrodes formed on the surface of the substrate at portions corresponding to intersections of the lateral and element-forming regions, respectively, in electrically insulated relationship with the substrate, the gate electrodes being aligned along the lateral regions. The semiconductor elements are formed at the intersections, respectively, each semiconductor element having a pair of portions of the impurity diffusion layers disposed at one of the intersection, and a channel region is formed between the portions of the diffusion layers and one of the gate electrodes formed at the one intersection. Also a method of making the semiconductor device includes respective steps of forming the above components constituting the semiconductor device.

18 Claims, 3 Drawing Sheets

SEMICONDUCTOR DEVICE HAVING FIELD-SHIELD ISOLATION STRUCTURES AND A METHOD OF MAKING THE SAME

BACKGROUND OF THE INVENTION

1. Field of The Invention

This invention relates to a semiconductor device having field-shield isolation structures and especially, adapted to be used for a semiconductor memory device such as DRAM (dynamic random access memory), EEPROM (electrically erasable programmable read only memory). It also relates to a flash memory and a method of making such a semiconductor device.

2. Description of The Related Art

There are known hitherto, as the element isolation technique, a method of local oxidation of silicon (LOCOS) as disclosed, for example, in JP-A-5-136429 and a trench isolation method as disclosed, for example, in JP-A-5-198778 and "A 3.6 $\mu m^2$ Memory Cell Structure for 16 MB EPROM" Y. Hisamune et al, IEDM-89, 1989, p.p. 583–586.

When it is desired, however, to increase the integration density of LSI, the LOCOS method involves problems such as generation of bird's beaks and space limitation in element-isolation due to the required thickness of the element-isolation oxide film. It also has a problem concerning electrical property such as field inversion due to lateral diffusion of impurities and short channel effects. On the other hand, the trench method requires complicated processes for forming trenches in a semiconductor substrate.

SUMMARY OF THE INVENTION

An object of the present invention is to provide a semiconductor device having field-shield isolation structures requiring smaller space for each element without generation of either field inversion or short channel effects.

According to the present invention, a semiconductor device comprises a semiconductor substrate of a first conductivity type, and a plurality of spaced field-shield isolation structures formed on a surface of the semiconductor substrate and extending parallelly in a first direction so as to provide element-forming regions at spaces between every adjacent two of the field-shield isolation structures. A pair of impurity diffusion layers of a second conductivity type is different from said first conductivity type formed in the surface of the semiconductor substrate at portions adjacent to opposite sides of each of the element-forming regions extending in the first direction. A plurality of spaced lateral regions is defined on the surface of said semiconductor substrate to extend parallelly in a second direction intersecting with the first direction. A plurality of discrete gate electrode structures are formed on the surface of the semiconductor substrate at portions corresponding to intersections of the lateral regions and the element-forming regions, respectively, in electrically insulated relationship with the semiconductor substrate, the gate electrode structures being aligned along the lateral regions. Semiconductor elements are formed at these intersections, respectively, each semiconductor element being formed with a pair of portions of the impurity diffusion layers disposed at one of the intersections, and a channel region is formed between the portions of the diffusion layers and one of the gate electrode structures formed at the one intersection.

According to one aspect of the present invention, a plurality of wiring layers are formed in the plurality of lateral regions, respectively, and each of the wiring layers acts as a control gate common to the semiconductor elements aligned along an associated one of the lateral regions.

According to another aspect of the present invention, the semiconductor device constitutes a semiconductor memory device including a plurality of memory cells formed of the semiconductor elements and a plurality of gate wiring layers are formed at the plurality of lateral regions to function as word lines of the semiconductor memory device.

According to a further aspect of the present invention, the semiconductor device constitutes a semiconductor memory device including a plurality of memory cells formed of the semiconductor elements and one of the pair of impurity diffusion layers functions as one of bit lines of the semiconductor memory device.

According to the present invention, a method of making a semiconductor device comprises the steps of: forming a composite layer including a first insulating film, a conductive film and a second insulating film in that order on a surface of a semiconductor substrate of a first conductivity type. The composite layer is etched so as to form a plurality of element isolation structures, respectively, on a plurality of spaced element isolation regions parallelly extending on the surface of the semiconductor substrate in a longitudinal direction and a pair of impurity diffusion layers of a second conductivity type different from said first conductivity type is formed in the surface of the semiconductor substrate at portions adjacent to opposing longitudinal sides of each of the element isolation structures by oblique ion-implantation using the element isolation structure as a mask. A predetermined pattern of gate structures is formed on the surface of the semiconductor substrate including the element isolation structures.

In the semiconductor device of the present invention, a plurality of spaced field-shield isolation structures are formed on a surface of a semiconductor substrate to extend parallelly in a first direction so that an element forming region is provided between every adjacent two of the isolation structures and a pair of impurity diffusion layers is formed in the surface of the semiconductor substrate at portions adjacent to opposite sides of each of the element forming regions extending in the first direction so as to form a channel region therebetween. With the above arrangement, it is possible to reduce the space for each element while maintaining the required element isolation ability.

Further, when a semiconductor memory device including a plurality of semiconductor memory cells is formed by using a semiconductor device of the present invention, it is possible to use one of a pair of impurity diffusion layers formed adjacent to opposite sides of each of the element forming regions extending in the first direction as a bit line of the memory device so that it is unnecessary to provide a bit contact for connection between each memory cell and the bit line. Thus, it is possible to greatly reduce the space for the memory device.

Additionally, in the present invention, gate wiring layers are formed at a plurality of spaced lateral regions extending in a second direction intersecting with the first direction, discrete gate electrode structures are formed on the surface of the semiconductor substrate at portions corresponding to intersections of the element forming regions and the lateral regions and a gate wiring layer aligned with each of the lateral regions is used as a control gate electrode common to a group of the semiconductor elements aligned with the lateral region and each of gate wiring layers is used as a word line of the memory device.

In the method of making a semiconductor device according to the present invention, a pair of impurity diffusion layers are formed by oblique ion-implantation of impurities in the surface of the semiconductor substrate at portions adjacent to opposite sides of each of the element isolation structures in self-alignment using the element isolation structure as a mask. Thus, it is possible to simplify the manufacturing processes.

DESCRIPTION OF THE PREFERRED EMBODIMENTS

One embodiment of the present invention will be explained with reference to the accompanying drawings.

Figure 1:
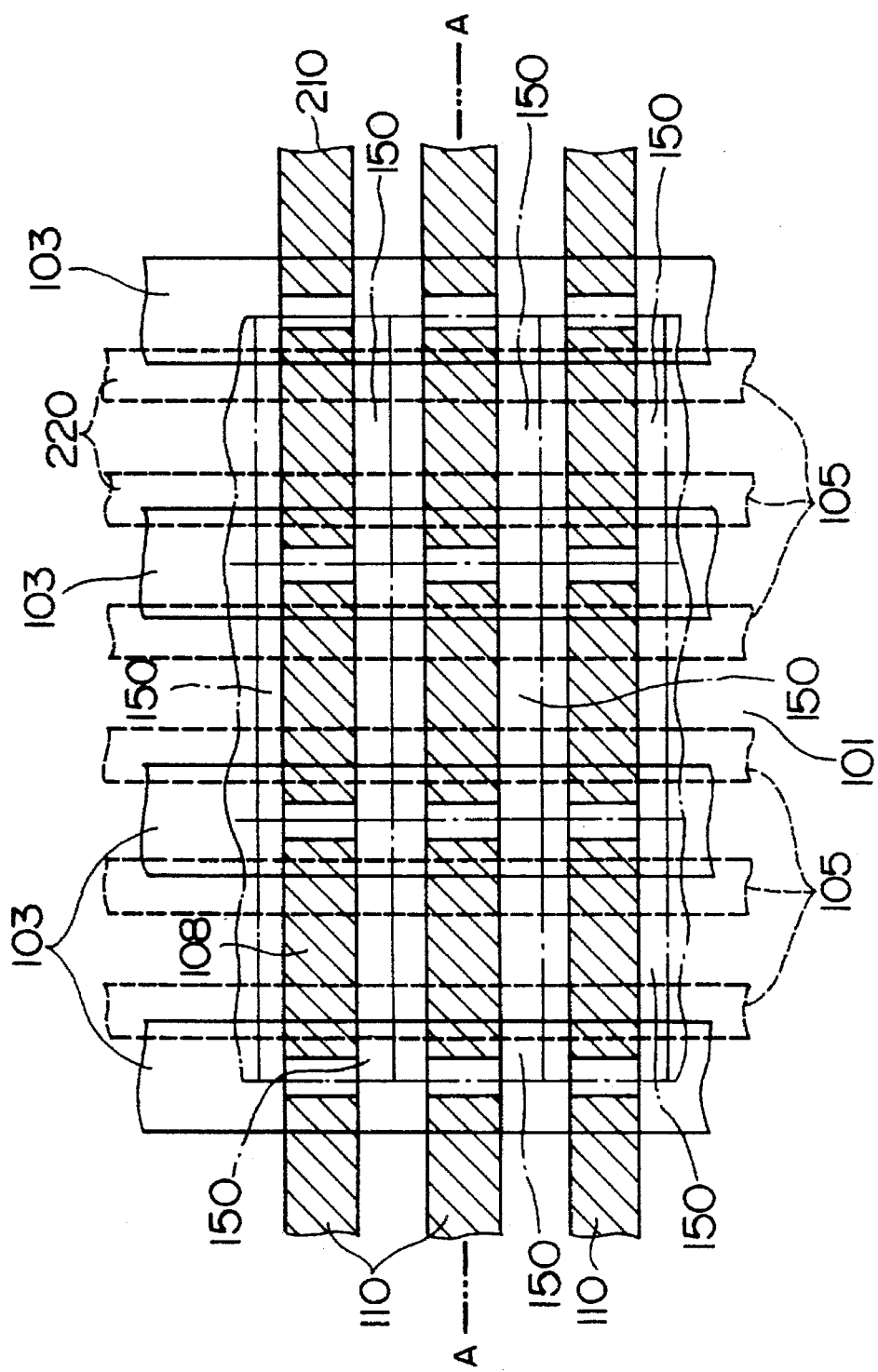
FIG. 1 is a plan view showing a structure of the memory cell part in EEPROM of a stacked gate type according to one embodiment of the present invention.
Figure 2:
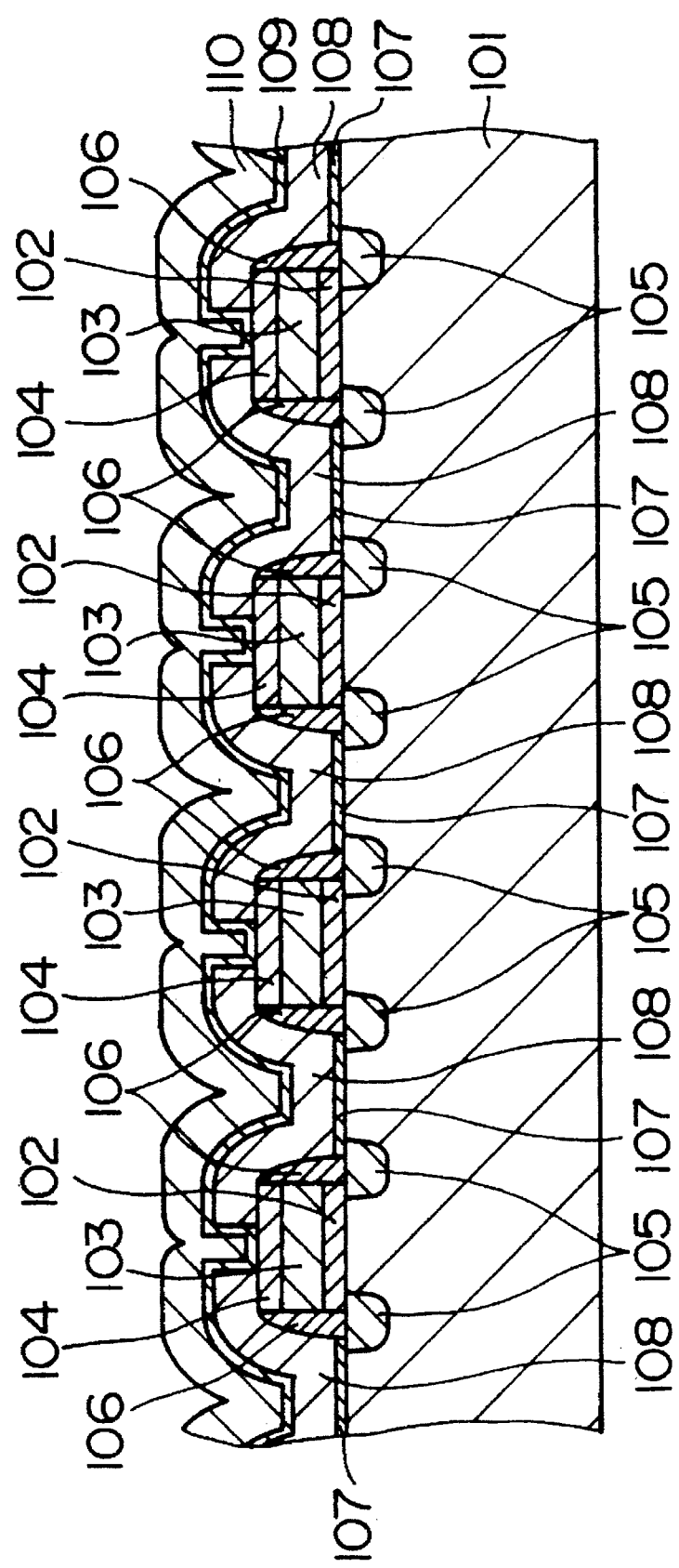
FIG. 2 is a sectional view of the memory cell part of FIG. 1 along the line II to II.

FIG. 1 shows a plan view showing a layout of memory cells in EEPROM of a stacked gate type according to one embodiment of the present invention and FIG. 2 shows a sectional view of the memory cell part of FIG. 1 taken along the line II to II.

As shown in FIG. 2, shield electrodes 103 of polycrystalline silicon films are formed in a pattern, as shown in FIG. 1, on a surface of a P-type silicon substrate 101 with interposed shield gate oxide films 102. Each shield electrode 103 is covered by a shield cap insulating film 104 and sidewall insulating films 106 thereby forming a field-shield isolation structure. With respect to the construction of field-shield isolation structure, please see "Fully Planarized 0.5 µm Technologies for 16M DRAM", W. Wakamiya et al, IEDM-88, 1988 p.p. 246 to 249.

The field-shield isolation structures include a plurality of spaced shield electrodes 103 extending parallelly in a longitudinal direction (vertical direction as viewed in FIG. 1) and an element forming region or an active region 220 is formed between every adjacent two of the field-shield isolation structures.

Further, a plurality of spaced lateral regions 210 are defined on the surface of the semiconductor substrate so as to extend parallelly in a lateral direction (horizontal direction as viewed in FIG. 1) intersecting preferably at a right angle with the longitudinal direction and individual semiconductor elements are formed on the surface of the semiconductor substrate 101 at portions corresponding to the intersections of the element forming regions 220 and the lateral regions 210 in a manner as mentioned hereinafter. First, a pair of N-type impurity diffusion layers 105 is formed in the surface of the silicon substrate 101 at portions adjacent to opposite longitudinal sides of each of the field-shield isolation structures extending in the longitudinal direction or portions adjacent to opposite longitudinal sides of each of the element forming regions 220 extending in the longitudinal direction. The diffusion layers act as source/drain diffusion layers 105 of a group of the semiconductor elements disposed along one of the element forming regions.

Further, on the surface of the silicon substrate 101 at portions corresponding to the intersections of the element forming regions and the lateral regions, a plurality of individual floating gates 108 of polycrystalline silicon films, as shown by hatching in FIG. 1, are formed with interposed tunnel insulating films 107 in alignment with each of the lateral regions. Also a wiring layer 110 of polycrystalline silicon film is formed in each of the lateral regions above the floating gates aligned along the lateral region with an interposed insulating film 109 therebetween. The wiring layer 110 functions as a control gate common to the semiconductor elements aligned along each of the lateral regions and also is used as one of the word lines when the semiconductor device is used as a semiconductor memory device including a plurality of memory cells 150, as shown by one-dot-chain lines in FIG. 1, arranged in a matrix of rows and columns, In FIG. 1, a pair of the source/drain diffusion layers 105 are common to a group of the memory cells 150 disposed along one of the element forming regions extending in a direction perpendicular to the word line. One of the source/drain diffusion layers 105 (or drain diffusion layer) acts as one of bit lines of the memory divide and the other source/drain diffusion layer (or source diffusion layer) acts as one of common source lines of the memory device. With this arrangement, it is unnecessary to provide a bit contact and a source contact to each of the memory cells 150 so that the space for each memory cell 150 can be reduced.

Next, a method of making the semiconductor device of the present invention will be explained with reference to FIGS. 3A to 3E.

FIGS. 3A to 3E show the sectional views corresponding to FIG. 2 at the respective steps in the manufacturing process according to one embodiment of the present invention.

Figure 3A:
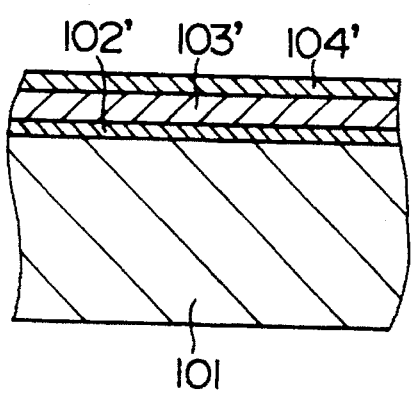
FIGS. 3A to 3E are sectional views of the memory cell part of EEPROM of a stacked gate type at the respective steps in the method of making the same according to one embodiment of the present invention.

First, as shown in FIG. 3A, a silicon oxide film 102' having a thickness of 50 to 100 nm, which is used for a shield gate oxide film 102, is formed on a P-type silicon substrate 101 by thermal oxidation or CVD method. Then, a P- or N-type doped polycrystalline silicon film 103' having a thickness of 100 to 300 nm and a silicon nitride film 104' having a thickness of 100 to 500 nm, which are used for a shield electrode 103 and a shield cap insulating film 104, respectively, are formed successively by CVD method on the silicon oxide film 102'.

Figure 3B:
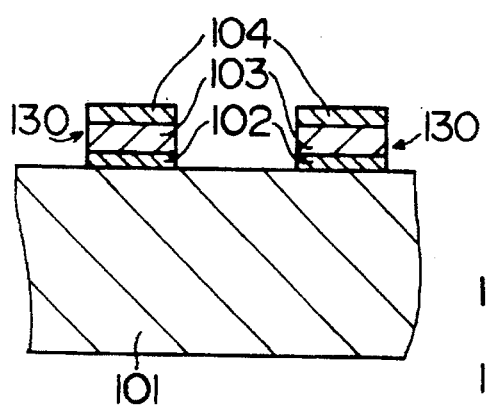

Next, as shown in FIG. 3B, a composite film including the silicon oxide film 102', the polycrystalline silicon film 103' and the silicon nitride film 104' is patterned by photolithography and anisotropic dry etching technique so as to form a lamination 130 of the shield gate oxide film 102, the shield electrode 103 and the shield cap insulating film 104 at each of predetermined element isolation regions.

Figure 3C:
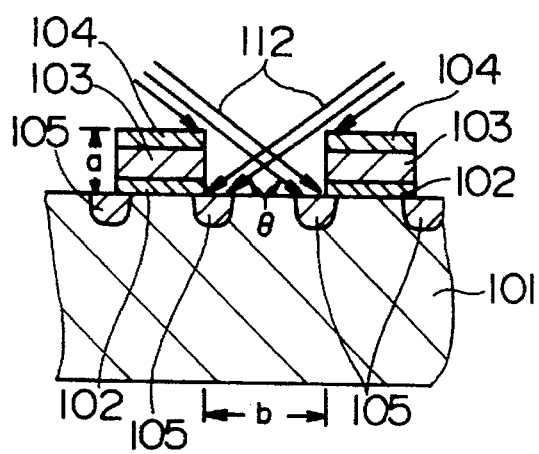

Then, as shown in FIG. 3C, impurity of As is implanted into the silicon substrate 101 by oblique ion-implantation 112 using the laminations, each including the shield gate oxide film 102, the shield electrode 103 and the shield cap insulating film 104, as a mask, thereby forming source/drain diffusion layers 105. The impurity of As is implanted at a rate of $5 \times 10^{15}$ cm$^{-2}$ with an energy of 50 to 90 KeV.

Further, the implantation angle θ is given by $$\theta = \tan^{-1}(a/b)$$

where a is a sum of the thicknesses of the shield gate oxide film 102, the shield electrode 103 and the shield cap insulating film 104 or a height of the lamination 130 and b is a distance between adjacent two of the laminations 130. For example, when the thicknesses of the shield gate oxide film 102, the shield electrode 103 and the shield cap insulating film 104 are 50 nm, 100 nm and 100 nm, respectively, that is a=0.25 µm, and the distance b is 1 µm, θ is about 14 to 15 degrees. On the other hand, when the thicknesses of the shield gate oxide film 102, the shield electrode 103 and the shield cap insulating film 104 are 100 nm, 300 nm and 500 nm, respectively, that is a=0.9 μm, and the distance b is 1 μm, the implantation angle θ is about 42 to 45 degrees.

As above-mentioned, by applying oblique ion-implantation 112 to the substrate 101 using the laminations of the shield gate oxide film 102, the shield electrode 103 and the shield cap insulating film 104 as a mask, a pair of spaced source/drain diffusion layers 105 are formed in self-alignment in the surface of the substrate at portions adjacent to the opposite longitudinal sides of each lamination. The implanted impurity is partially diffused laterally during succeeding thermal treatment so that the source/drain diffusion layers 105 overlap the shield gate films 102 at undersides thereof.

Figure 3D:
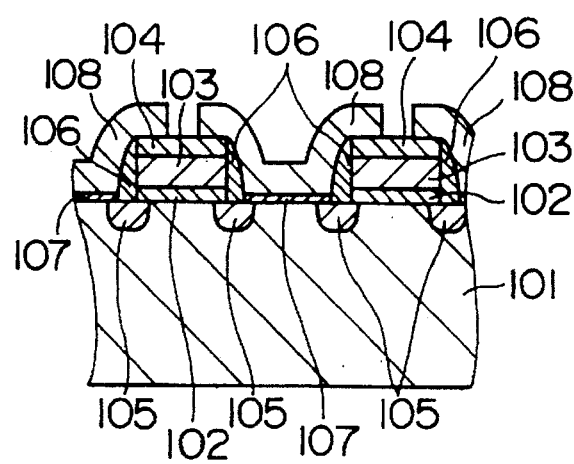

Next, as shown in FIG. 3D, a silicon nitride film having a thickness of 100 to 300 nm is deposited on a whole surface of the product and patterned by anisotropic dry etching to form sidewall insulating films 106 on the side walls of the lamination 130 of the shield gate oxide film 102, the shield electrode 103 and the shield cap insulating film 104. Then, a tunnel oxide film 107 is formed at a thickness of about 10 nm on the surface of the silicon substrate 101 by thermal oxidation thereof. In order to prevent the polycrystalline silicon of the shield electrode 103 from being oxidized, the shield cap insulating film 104 and the sidewall insulating film 106 are desirably made of silicon nitride films having anti-oxidation property, but one or both of them may be made of silicon oxide film.

Thereafter, a polycrystalline silicon film is deposited at a thickness of 100 to 300 nm by CVD technique on a whole surface of the product and patterned by photolithography and anisotropic dry etching to form floating gates 108 at portions shown by hatching in FIG. 1.

Figure 3E:
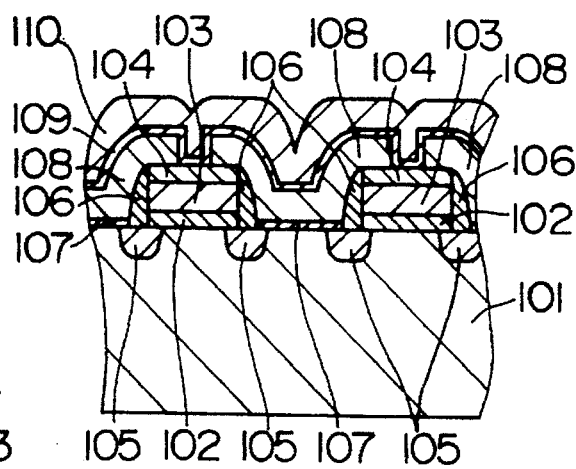

Then, as shown in FIG. 3E, an ONO film 109 including a silicon oxide film, a silicon nitride film and a silicon oxide film is deposited on a whole surface of the product. The thickness of the ONO film 109 is 15 to 20 nm as converted to a thickness of the silicon oxide film having the same capacitance. The bottom and top silicon oxide films are formed by thermal oxidation or CVD method. A silicon oxide film may be used in place of the ONO film 109.

Next, a polycrystalline silicon film is deposited at a thickness of 100 to 300 nm on a whole surface of the product and patterned by photolithography and anisotropic dry etching to form word lines (control gates) 110. In order to reduce the resistance of the word line 110, the polycide structure may be used.

Thereafter, a process for forming various wirings is carried out by known steps, which are the same as those conventionally carried out and hence explanation thereof is omitted.

The present invention has been described with reference to an embodiment applied to a stacked gate type EEPROM having floating gates 108. However, it will be understood that the present invention can be similarly applied to a MNOS type non-volatile semiconductor memory device to which a high voltage is applicable. Further, the present invention is also applied to various kinds of semiconductor devices having source and drain regions by modifying the process for forming the gate structure in the above-mentioned method. For example, when MOS transistors are made, a gate oxide film is formed on the silicon substrate 101 in the processes shown in FIGS. 3D and 3E and then a pattern of gate wires is formed on the gate oxide film.

In the present invention, the element isolation is achieved by the field-shield isolation structures and the source/drain diffusion layers are formed in the surface of the substrate at portions adjacent to the opposite sides of each field-shield isolation structure. Further, each channel region is formed along one of the gate wiring layers or word lines so that the space for each semiconductor element can be reduced.

Since the element isolation is achieved by field-shield isolation structures, the field inversion and the short channel effects can be prevented by selecting the potential applied to the shield electrode.

Further, it is possible to simplify the process for making the source/drain regions since the source/drain regions are formed in self-alignment by oblique ion-implantation in the surface of the substrate at portions adjacent to the opposite sides of each field-shield isolation structure.

I claim:

1. A semiconductor device comprising:
   a semiconductor substrate of a first conductivity type;
   a plurality of spaced field-shield isolation structures formed on a surface of the semiconductor substrate and extending parallelly in a first direction so as to provide element-forming regions at spaces between every adjacent two of the field-shield isolation structures;
   a pair of impurity diffusion layers of a second conductivity type different from said first conductivity type formed in the surface of said semiconductor substrate at portions adjacent to opposite sides of each of said element-forming regions extending in said first direction;
   a plurality of spaced lateral regions defined on the surface of said semiconductor substrate to extend in a second direction intersecting with said first direction; and
   a plurality of gate electrode structures formed on the surface of said semiconductor substrate at portions corresponding to intersections of said lateral regions and said element-forming regions, respectively, and insulated from said semiconductor substrate, said gate electrode structures being aligned along said lateral regions;
   wherein semiconductor elements are formed at said intersections, respectively, each being formed of a pair of portions of said impurity diffusion layers disposed at one of the intersections, a channel region formed between said portions of the diffusion layers and one of said gate electrode structures formed at the one intersection.

2. A semiconductor device according to claim 1, wherein each of said field-shield isolation structures includes at least a shield electrode formed on the surface of said semiconductor substrate with an insulating film interposed therebetween and extending in said first direction.

3. A semiconductor device according to claim 1, further comprising a plurality of gate wiring layers formed on the lateral regions, respectively, each of said gate wiring layers operating as a control gate common to a group of the semiconductor elements disposed along an associated one of the lateral regions.

4. A semiconductor device according to claim 1, wherein the semiconductor elements constitute a semiconductor memory device having a plurality of memory cells formed of said semiconductor elements and said gate wiring layers operate as word lines of the semiconductor memory device.

5. A semiconductor device according to claim 1, wherein the semiconductor elements constitute a semiconductor memory device having a plurality of memory cells formed of said semiconductor elements and one of said pair of diffusion layers operates as a bit line of the semiconductor memory device.

6. A semiconductor device comprising:
   a semiconductor substrate of a first conductivity type;
   a plurality of spaced field-shield isolation structures formed on a surface of the semiconductor substrate and extending parallelly in a longitudinal direction so as to provide element-forming regions at spaces between every adjacent two of the field-shield isolation structures;

a pair of impurity diffusion layers of a second conductivity type different from said first conductivity type formed in the surface of said semiconductor substrate at portions adjacent to longitudinal opposite sides of each of said element-forming regions;

a plurality of spaced lateral regions defined on the surface of said semiconductor substrate to extend in a lateral direction intersecting with said longitudinal direction; and a plurality of individual semiconductor elements formed on the surface of said semiconductor substrate at portions corresponding to intersections of said lateral regions and said element-forming regions, respectively, each semiconductor element including a pair of portions of said impurity diffusion layers disposed at one of the intersections and a channel region formed between said portions of the diffusion layers.

7. A semiconductor device according to claim 6, wherein each of said field-shield isolation structures includes a shield electrode formed on the surface of said semiconductor substrate and extending in the longitudinal direction and sidewall insulating films formed to cover opposite longitudinal side walls of the shield electrode.

8. A semiconductor device according to claim 6, wherein each of said semiconductor elements includes a gate electrode structure formed on the surface of the semiconductor substrate at one of the intersections.

9. A semiconductor device according to claim 8, wherein said gate electrode structure includes a gate insulating film formed on the surface of said semiconductor substrate at said one intersection, a floating gate formed on said gate insulating film and a control gate formed on said floating gate with an interlayer insulating film therebetween.

10. A semiconductor device according to claim 9, further comprising a gate wiring layer formed over the gate electrode structures of a group of the semiconductor elements aligned along one of the lateral regions, said gate wiring layer operating as the control gate common to said group of the semiconductor elements.

11. A semiconductor device comprising:

a semiconductor substrate of a first conductivity type;

a plurality of spaced field-shield isolation structures formed on a surface of the semiconductor substrate and extending parallelly in a first direction so as to provide element-forming regions at spaces between every adjacent two of the field-shield isolation structures;

a pair of impurity diffusion layers of a second conductivity type different from said first conductivity type formed in the surface of said semiconductor substrate at portions adjacent to opposite sides of each of said element-forming regions extending in said first direction;

a plurality of spaced lateral regions defined on the surface of said semiconductor substrate to extend in a second direction perpendicular to said first direction;

a plurality of discrete gate electrodes formed on the surface of said semiconductor substrate at portions corresponding to intersections of said lateral regions and said element-forming regions, respectively, in electrically insulated relationship with said semiconductor substrate, said gate electrodes being aligned along said lateral regions; and a plurality of gate wiring layers formed on said lateral regions, respectively, each of said gate wiring layers being disposed over a group of the gate electrodes aligned with one of the lateral regions in electrically insulated relationship with the gate electrodes;

wherein semiconductor elements are formed at said intersections, respectively, each being formed of a pair of portions of said impurity diffusion layers disposed at one of the intersections, a channel region formed between said portions of the diffusion layers and one of said gate electrodes formed at the one intersection and operating as a floating gate thereof and each of said gate wiring layers operating as a control gate common to the group of the semiconductor elements on which the gate wiring layer is disposed.

12. A semiconductor device having a field-shield isolation structure comprising:

a first insulating film formed on a semiconductor substrate;

a shield electrode formed on said first insulating film, said shield electrode constituting said field-shield isolation structure together with said first insulating film;

a first gate electrode of a transistor formed on said semiconductor substrate at a portion adjacent to said shield electrode with a second insulating film interposed therebetween and insulated from said semiconductor with a third insulating film;

an impurity diffusion layer formed in said semiconductor substrate at a portion under said second insulating film and acting as a source or drain of said transistor; and wherein said gate electrode operates as a floating gate of said transistor.

13. A semiconductor device according to claim 12, wherein said first insulating film has a thickness larger than that of said third insulating film.

14. A semiconductor device according to claim 12, further comprising a second gate electrode formed on said first gate electrode with a fourth insulating film interposed therebetween.

15. A semiconductor device comprising:

a first insulating film formed on a semiconductor substrate;

first and second electrodes formed on said first insulating film for element-isolation;

impurity diffusion layers formed in said semiconductor substrate at portions adjacent to respective end portions of said first and second electrodes and opposite to each other;

an active region formed between said impurity diffusion layers in said semiconductor substrate; and a gate electrode structure of a transistor formed on said active region with a second insulating film interposed therebetween; and wherein said gate electrode structure includes a floating gate wholly surrounded by an insulating layer.

16. A semiconductor device according to claim 15, wherein said gate electrode structure further includes a control gate formed on said floating gate with a third insulating film interposed therebetween.

17. A semiconductor device according to claim 15, wherein said insulating layer includes a sidewall insulating layer for insulating between each of said first and second electrodes and said gate electrode structure and surrounding sides of each of said first and second electrodes.

18. A semiconductor device according to claim 17, wherein said sidewall insulating layer is formed on said impurity diffusion layers.

* * * * *